(12) United States Patent
Terasaki

(10) Patent No.: US 7,944,040 B2
(45) Date of Patent: May 17, 2011

(54) SEMICONDUCTOR DEVICE AND ELECTRONIC APPARATUS EQUIPPED WITH THE SEMICONDUCTOR DEVICE

(75) Inventor: Fumihiko Terasaki, Kyoto (JP)

(73) Assignee: Rohm Co., Ltd, Kyoto (JP)

( * ) Notice: Subject to any disclaimer, the term of this patent is extended or adjusted under 35 U.S.C. 154(b) by 18 days.

(21) Appl. No.: 12/748,217

(22) Filed: Mar. 26, 2010

(65) Prior Publication Data

US 2010/0181668 A1 Jul. 22, 2010

Related U.S. Application Data

(62) Division of application No. 10/948,100, filed on Sep. 23, 2004, now Pat. No. 7,719,107.

(30) Foreign Application Priority Data

Sep. 25, 2003 (JP) .................................. 2003-332795

(51) Int. Cl.
H01L 23/14 (2006.01)
H01L 23/52 (2006.01)
H01L 23/48 (2006.01)
H01L 29/40 (2006.01)

(52) U.S. Cl. ........ 257/690; 257/503; 257/692; 257/738; 257/774; 257/778; 257/784; 257/786; 257/E23.005; 257/E23.011; 257/E23.02; 257/E23.021; 257/E23.067; 257/E23.069; 257/E23.07; 257/E23.079

(58) Field of Classification Search ........................ None
See application file for complete search history.

(56) References Cited

U.S. PATENT DOCUMENTS

| | | | | |
|---|---|---|---|---|
| 6,838,773 | B2 | 1/2005 | Kikuchi et al. | 257/773 |
| 6,936,911 | B1 | 8/2005 | Horimoto | 257/665 |
| 7,141,819 | B2 * | 11/2006 | Maruko | 257/48 |
| 2004/0017008 | A1 | 1/2004 | Ueda | 257/734 |
| 2004/0032359 | A1 | 2/2004 | Lebedev | 341/161 |
| 2004/0145061 | A1 | 7/2004 | Kanai et al. | 257/773 |
| 2005/0040536 | A1 | 2/2005 | Buffet et al. | 257/776 |

FOREIGN PATENT DOCUMENTS

| | | |
|---|---|---|
| JP | 10-050922 | 2/1998 |
| TW | 507339 A | 10/2002 |
| TW | 517357 A | 1/2003 |

* cited by examiner

Primary Examiner — Hoang-Quan T Ho
(74) Attorney, Agent, or Firm — DLA Piper LLP (US)

(57) ABSTRACT

A semiconductor device comprises an IC chip body and a package substrate that has thereon many external electrodes arranged in a two-dimensional grid configuration. Groups of signal lines that are likely to emit noise (noisy signal lines) are separated and spaced apart from groups of signal lines that are susceptible to noise (noise susceptible signal lines). Each of the noisy signal lines and noise susceptible signal lines is connected to an associated member of an associated IC pad group separated and spaced apart from other IC pad groups. Further, each of the noisy signal lines and noise susceptible signal lines is connected to an associated member of an associated external electrode group selected from the multiplicity of external electrodes arranged in a two-dimensional grid configuration on the package substrate. Thus, groups of potentially interfering signal lines are mutually separated and spaced apart from one another, thereby suppressing the noise.

7 Claims, 2 Drawing Sheets

SEMICONDUCTOR DEVICE AND ELECTRONIC APPARATUS EQUIPPED WITH THE SEMICONDUCTOR DEVICE

CROSS-REFERENCE TO RELATED APPLICATIONS

This application is a divisional of application Ser. No. 10/948,100, filed on Sep. 23, 2004, and claims the benefit of priority under 35 USC 119 of Japanese Patent Application No. 2003-332795, filed on Sep. 25, 2003, which are incorporated herein by reference.

FIELD OF THE INVENTION

The invention relates to a semiconductor device including analog and digital circuits and having many terminals arranged in a two-dimensional grid configuration. The invention also relates to an electronic apparatus equipped with such semiconductor device.

BACKGROUND OF THE INVENTION

Nowadays, various semiconductor devices such as semiconductor integrated circuits (ICs) are manufactured as independent semiconductor parts. These semiconductor devices are used in various kinds of electronic apparatuses. Such semiconductor device has a chip including semiconductor ICs (the chip hereinafter referred to as IC chip body) packaged in such a way that the ICs can be connected to external devices via external terminals provided on the device.

The IC chip body is provided with many electrode pads (hereinafter simply referred to as IC pads). Each of the pads is connected to an associated external terminal. In recent years, however, a method-of connecting the pads to the external terminals has been increasingly changed from conventional one that utilizes flat-pack type QFP (Quad Flat Package) or SOP (Small Outline Package) that utilizes lead terminals, to one that utilizes a ball grid array (BGA) structure.

A chip-size package (CSP) has been also in use that is based on a similar connection technique utilizing BGA. The CSP has substantially the same outside dimensions as the IC chip body used. In a CSP structure, pads are provided on one side of a substrate for use in packaging the ICs (hereinafter referred to as package substrate), each pad facing an associated pad of the IC chip body. Provided on the other side of the package substrate are ball-shaped external electrodes arranged in a two-dimensional lattice (or grid). The pads are respectively connected to associated external electrodes on the package substrate (See, for example, Japanese Patent Early Publication No. H10-50922).

Each of the external electrodes of the CSP has a ball-shaped solder bump and arranged in a two-dimension array over a predetermined area of the underside of the semiconductor device. Thus, the CSP can be formed thin and compact in size close to the size of the chip. Further, the CSP can be mounted on the surface of a printed-circuit board.

In a semiconductor device having a conventional QFP structure, the external electrodes are arranged at substantially the same locations as the pads of the IC chip body. Therefore, if a signal line that is likely to interfere with other signal lines exists, the interference can be reduced by simply laying out the IC pads not to incur such interference.

In a semiconductor device having a grid array structure, many external electrodes are arranged in a two-dimension lattice. In this case also, if signal lines exist that are likely to incur interference with other signal lines when located in close proximity, pads for these signal lines are separated and spaced apart from one another, thereby suppressing possible interference. However, under a certain layout of numerous external electrodes in a two-dimensional lattice of on a package substrate, a case may arise where some of the external electrodes can come in close proximity to one another, though the IC pads connected to these external electrodes are separated and spaced apart. As a consequence, a problem arises then that signal lines that can interfere when located in close proximity are actually come in close proximity.

SUMMARY OF THE INVENTION

It is, therefore, an object of the invention to provide a semiconductor device with means for reducing interference among signal lines connected to a multiplicity of external electrodes arranged in a two-dimensional grid array by separating and spacing apart those signal lines from one another if the signal lines are likely to interfere within an IC chip body and a package substrate.

It is another object of the invention to provide an electronic apparatus that incorporates such inventive semiconductor device on, for example, the printed circuit board thereof, exhibiting only reduced interference among the signal lines.

In accordance with one aspect of the invention, there is provided a semiconductor device, comprising:
an IC chip body that includes
circuit sections each having signal lines that are connected thereto and likely to emit noise (the signal lines referred to as noisy signal lines),
circuit sections each having signal lines that are connected thereto and susceptible to noise (the signal lines referred to as noise susceptible signal lines), and
a multiplicity of IC pads arranged in a rectangular configuration on one side of, and along the periphery of, the IC chip body; and
a package substrate that includes
an insulating substrate having a multiplicity of via-holes (through-holes) formed to penetrate from one side to the other side of the insulating substrate,
a multiplicity of pads formed on one side of said insulating substrate (the pads referred to as substrate pads), the substrate pads facing the IC pads and electrically connected to the IC chip body,
a multiplicity of external electrodes formed to protrude from the other side of the insulating substrate, the external electrodes arranged in a grid configuration and surrounded by the substrate pads;
a multiplicity of lead wires individually passing through one of the via-holes, each of the lead wires connecting one of the substrate pads to an associated one of the external electrodes, wherein:
each of the noisy lines is connected to an associated member of a first group of IC pads of the IC pads (the group referred to as first IC pad group), while each of the noise susceptible lines is connected to an associated member of a second group of IC pads of the IC pads (the group referred to as second IC pad group);
each member of said first IC pad group is connected to an associated member of a first group of external electrodes selected from the multiplicity of external electrodes (the first group of external electrodes referred to as first external electrode group), while each member of the second IC pad group is connected to an associated member of a second group of external electrodes selected from the multiplicity of external electrodes (the second group of external electrodes referred to as second external electrode group); and the first IC pad group is separated and spaced apart from the second IC pad group, and the first external electrode group is separated and spaced apart from the second external electrode group.

The package substrate can be a rewiring layer.

One or more other IC pads each having a low impedance may be provided between the first and second IC pad groups, while one or more other external electrodes each having a low impedance may be provided between the first and second external electrode groups.

The first and second groups of the IC pads may occupy different ends or corners of the multiplicity of IC pads.

The first and second groups of external electrodes respectively occupy different ends of, or locations near outermost ends of, said multiplicity of external electrodes.

The first and second external electrode groups associated with signal lines that are more likely to emit noise or more likely to be susceptible to noise respectively occupy outermost ends of said multiplicity of external electrodes with a higher priority.

The circuit sections connected to noisy signal lines include a clock circuit or a large-current input/output circuit.

The circuit sections connected to noise susceptible signal lines include amplifier circuits having high input-impedances or input/output circuits that have analog properties. Those circuits may include an analog circuit and a digital circuit. The external electrodes may be ball-shaped.

The inventive semiconductor device may be used as a component of an electronic apparatus.

In the inventive semiconductor device, a multiplicity of external electrodes are arranged in a two-dimensional lattice or grid configuration, with noisy signal lines and noise susceptible signal lines are separated in different groups and spaced apart from the rest of the signal lines. The noisy signal lines and the noise susceptible signal lines are respectively connected to separate groups of the IC pads (each group referred to as IC pad group).

Moreover, the noisy signal lines and the noise susceptible signal lines are respectively connected to different groups of external electrodes separated and spaced apart from other groups.

Thus, signal lines that can interfere with one another are separated and spaced apart from one another on the IC chip body and on the package substrate. This enables reduction of mutual interference among the signal lines. By reducing such interference in this way, both erroneous operation and undesirable noise are decreased.

Further, the signal lines that are more likely to emit noise or more likely to be susceptible to noise are connected to the external electrodes occupying the outermost ends of the multiplicity of external electrodes with a higher priority. Thus, the signal lines can be appropriately located in accordance with their likelihood of interference with other signal lines, even under a limitation that certain signal lines must be separated and spaced apart from others.

DETAILED DESCRIPTION OF THE PREFERRED EMBODIMENT

Figure 1:
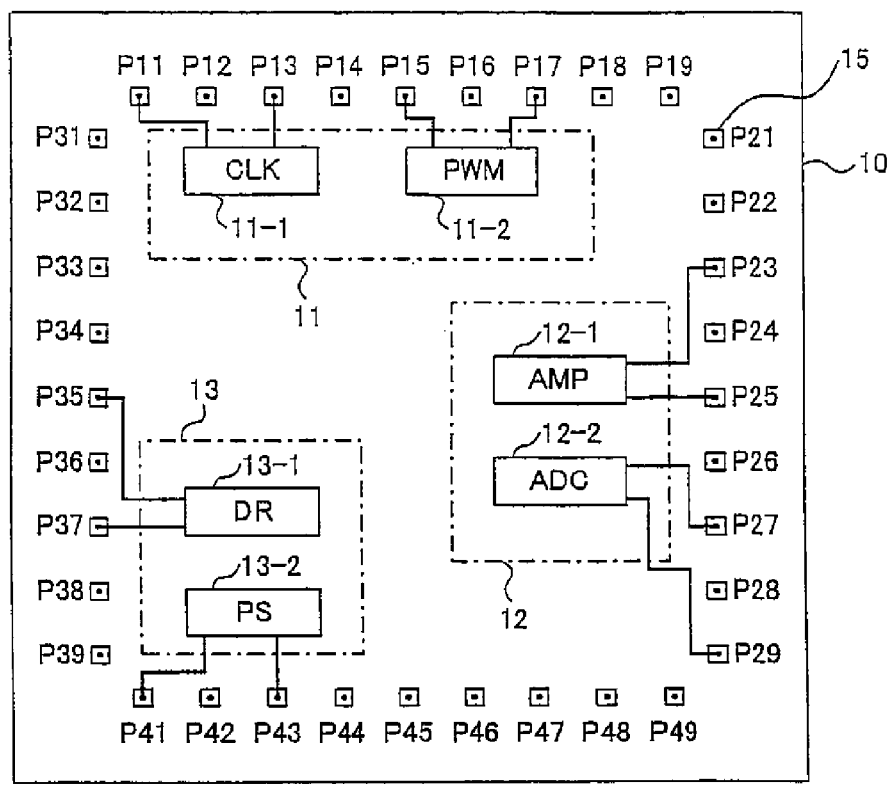
FIG. 1 is a schematic diagram showing an IC chip body of a semiconductor device according to the invention.
Figure 2:
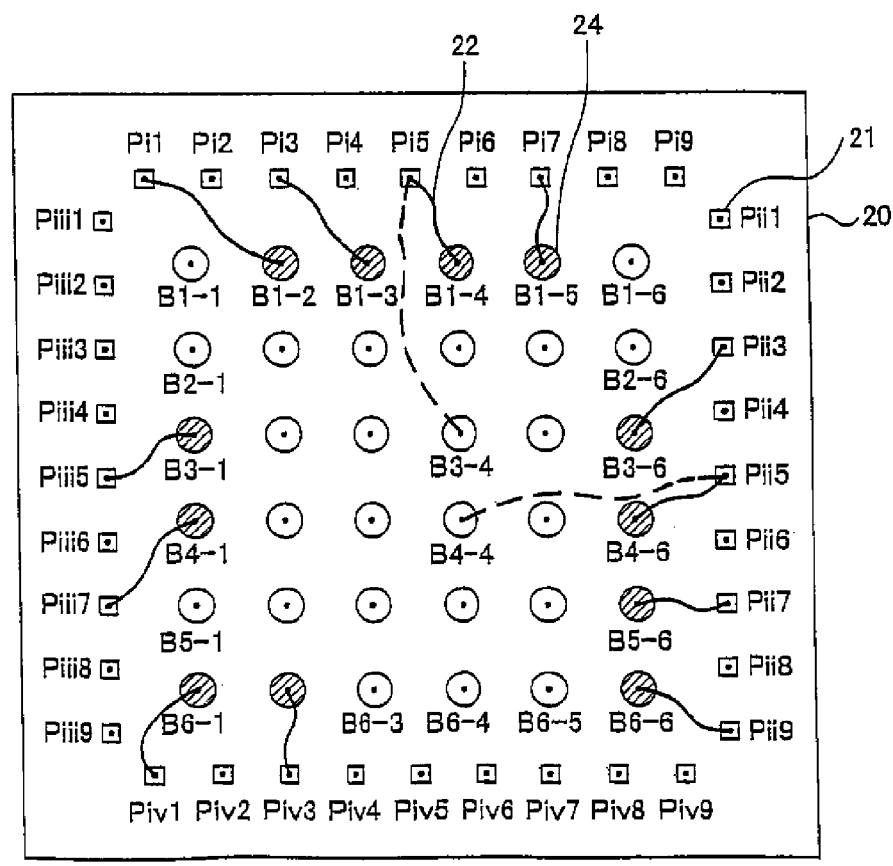
FIG. 2 is a schematic diagram showing a substrate for use with the IC chip body of FIG. 1.
Figure 3:
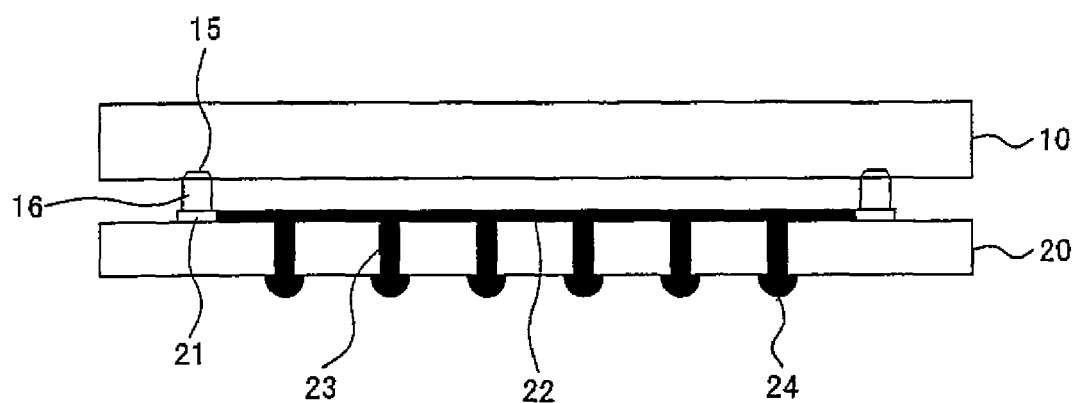
FIG. 3 is a sectional view of the semiconductor device having the IC chip body of FIG. 1 and the substrate of FIG. 2.

The invention will now be described in detail by way of example with reference to the accompanying drawings. Referring to FIGS. 1-3, there is shown a structure of the semiconductor device in accordance with an embodiment of the invention. FIG. 1 shows the configuration of an IC chip body 10 of the inventive semiconductor device. FIG. 2 shows the configuration of a package substrate 20 for use with the semiconductor device. The IC chip body 10 and the package substrate 20 together constitute the semiconductor device of the invention.

The IC chip body 10 of FIG. 1 has a circuit section 11 connected to noisy signal lines, a circuit section 12 connected to noise susceptible signal lines, and a circuit section 13 connected to signal lines through which large currents can flow (the signal line referred to as large-current signal lines). These circuit sections 11, 12, and 13 are preferably separated and spaced apart from one another. The IC chip body may include many other signal-processing circuits and I/O circuit, etc (not shown).

The IC chip body 10 is provided, along the periphery thereof, and on one side thereof (e.g. the side having circuit components), with a multiplicity of IC pads 15 arranged in a rectangular configuration. Although these IC pads are shown to be square in FIG. 1, they can be rectangle, or arranged in a row.

As shown in FIG. 1, the multiplicity of IC pads 15 includes IC pads P11-P19 located at the upper end, P21-P29 located at the right end, P31-P39 located at the left end, and P41-P49 located at the lower end of the IC chip body 10.

The circuit section 11 includes a clock circuit (CLK) 11-1 and a pulse width modulation (PWM) circuit 11-2. The signal lines connected to the clock circuit 11-1 and the PMW circuit 11-2 are noisy signal lines, since these signals transmit pulse signals. Each of these noisy signal lines is connected to an associated member of a first group of IC pads selected from the multiplicity of IC pads 15 (the group referred to as first IC pad group). In the example shown herein, the first IC pad group includes IC pads P11, P13, P15, and P17 that are located at the upper end of the chip.

The circuit section 12 includes, for example, an amplification circuit (AMP) 12-1 such as an audio amplifier, an A/D converter circuit (ADC) 12-2, and a D/A converter circuit (not shown). The amplifier circuit 12-1 and A/D converter circuit 12-2 are of high input impedance, and the signal lines connected thereto are noise susceptible signal lines.

Similarly, signal lines connected to analog output circuits having analog properties are also noise susceptible signal lines. Each of these noise susceptible signal lines is connected to an associated member of a second group of IC pads 15 selected from the multiplicity of IC pads 15 (the group referred to as second IC pad group). In the example shown herein, the second group of the IC pads 15 includes pads P23, P25, P27, and P29 located at the right end of the IC chip body.

The circuit section 13 includes, for example, a drive circuit (DR) 13-1 such as a light emitting element drive circuit, and a power supply circuit (PS) 13-2. Through the signal lines connected to the drive circuit 13-1 and power supply circuit 13-2 flow large currents that vary greatly in time. Therefore, these signal lines (referred to as large-current signal lines) are also noisy signal lines.

Each of these large-current signal lines is connected to an associated member of a third group of IC pads 15 selected from the multiplicity of IC pads 15 (the group referred to as third IC pad group). In the example shown herein, the third IC pad group includes pads P35 and P37 located at the lower section of the left end of the chip body and pads P41 and P43 located at the left section of the lower end of the chip body. That is, the IC pads 15 of the third IC pad group are located at the corner of the left end and the lower end of the chip body.

From the point of noise suppression, it is sufficient to have the IC pads 15 of the first, second, and third IC pad groups are separated and spaced apart from one another. Therefore, those IC pads 15 of the respective groups may be arranged at different ends and/or corners of the chip body.

The first through third groups of IC pads 15 may be separated from each other such that at least one (preferably more than one) extra IC pad(s) not belonging to any of these groups may be provided among them, thereby separating these IC pad groups from each other. The extra IC pad is preferably of low impedance. For example, it can be a pad connected to the ground or a power source, or a pad connected to the ground via a capacitor.

The package substrate 20 shown in FIG. 2 can be an insulating substrate such as a printed circuit board, a film substrate, and a carrier tape. The package substrate 20 has on one side thereof substrate pads 21 and, on the other side thereof, external electrodes 24. These substrate pads 21 respectively face associated IC pads 15 of the IC chip body 10, and jointed to the respective IC pads 15 by bumps for example.

In the example shown herein, like the IC pads 15 on the IC chip body, there are 9 substrate pads 21 per one end of the substrate. Thus, in total 36 pads are provided along the periphery of the substrate. Provided in a central region of the substrate 20, surrounded by the substrate pads 21, are many external electrodes 24 arranged in a lattice (or a grid) configuration. In the example shown herein, each of the external electrodes 24 is associated with one substrate pad 21, so that there are in total 36 (=6×6) external electrodes.

It is preferred to provide, among the first through third groups of substrate pads 21, at least one (preferably more than one) extra substrate pad(s) that does not belong to any of these groups, as for extra pads provided among the first through third groups of IC pads 15, thereby separating the substrate pad groups from each other.

Each of the external electrodes 24 is formed to pass through one of the via-holes formed at every lattice position from one side of the insulating substrate to the other to establish electrical connection with an external line. These external electrodes 24 as a whole form a lattice, as indicated by symbols B1-1-B6-6 as shown. Each of the electrodes 24 is preferably made of a solder shaped like a ball. The ball-shaped external electrodes arranged in a lattice configuration is called ball grid array (BGA).

Of course, any other external electrodes such as bump electrodes other than BGA can be used equally well. Each of the external electrodes 24 may be a pin, then the pins as a whole forming a pin grid array (PGA).

Each of the external electrodes 24 is connected to an associated one of the substrate pads 21 by a lead wire 22 on one side of the package substrate.

Referring to FIG. 3, there is shown in section an exemplary structure of the semiconductor device shown in FIGS. 1 and 2. Built in the IC chip body 10 are the circuit section 11 to which noisy signal lines are connected, the circuit section 12 to which noise susceptible signal lines are connected, and the circuit section 13 to which large-current signal lines are connected, as described previously.

The IC pads 15 are formed on one surface of the IC chip body 10. There are provided post-shaped bumps 16 one for each IC pad 15 in electrical contact therewith.

The pads 21 of the package substrate 20 are connected to the respective IC pads 15 of the IC chip body 10 by the respective bumps 16. Further, each pad 21 is connected to an associated external electrode 24 by a lead wire 22. Each of the external electrodes 24 penetrates a via-hole (through-hole) 23 formed in the package substrate, as described above. It should be understood that the bumps 16 may be provided on the pads 21, or on both the IC pads 15 and pads 21.

Lead wires 22 are normally passed between outer external electrodes for ease of wiring, avoid electric contact with these electrodes, and connected to inner external electrodes. Conventionally, however, lead wires 22 are routed in the easiest way for ease of wiring, irrespective of whether the lead wires are noisy signal lines, noise susceptible signal lines, or large-current signal lines.

As a consequence, there can be instances where problematic interference of signals cannot be fully reduced if noisy signal lines, noise susceptible signal lines, and large-current signal lines are separated and spaced apart in the arrangements of signal lines and the IC pad groups on the IC chip body 10, as shown in FIG. 1.

This problem arises from the fact that a noisy signal line such as the output line of the PWM circuit 11-2 (signal line lying between Pi5 [the substrate pad] and B3-4 [the external electrode]) come into close proximity to a noise susceptible signal line such as the output line of the amplifier circuit 12-1 (signal line lying between Pii5 [the substrate pad] and B4-4 [the external electrode]) in the process of connecting the signal lines to the associated external electrodes, 24 arranged in a grid configuration on the substrate 20, as indicated by broken lines in FIG. 2. In this case, noise due to cross talk becomes influential.

In the present invention, the substrate pads 21, to which the first IC pad group of the multiplicity of IC pads 15 are connected, are connected to a group of the external electrodes occupying one of the outermost ends (e.g. upper end) of the multiplicity of external electrodes arranged in the grid configuration. For example, a signal line of the clock circuit 11-1 in the circuit section 11 is connected to the IC pad P11 to establish a path to the external electrode B1-2 via the substrate pad Pi1.

The substrate pads 21, to which the second IC pad group of the multiplicity of IC pads 15 are connected, are connected to a group of the external electrodes occupying another outermost end (e.g. right end) of the multiplicity of external electrodes. For example, a signal line of the amplifier circuit 12-1 in the circuit section 12 is connected to the IC pad P23 to establish a path to the external electrode B3-6 via the substrate pad Pii3.

The substrate pads 21, to which the IC pads 15 of the third IC pad group of the multiplicity of IC pads 15 are connected to the external electrodes occupying one of the outermost corners (e.g. the corner of the left and lower ends) of the multiplicity of external electrodes. For example, a signal line of the drive circuit 13-1 in the circuit section 13 is connected to the IC pad P35 to establish a path to the external electrode B3-1 via the substrate pad Piii5. Other signal lines of the circuit sections 11, 12, and 13 are connected to associated ones of the external electrodes in the same manner.

The first through third groups of external electrodes 24 may be separated from each other such that at least one (preferably more than one) extra external electrode(s) not belonging to any of these groups may be provided among them. The extra external electrode is preferably of low impedance. For example, it can be an external electrode connected to the ground or a power source, or an external electrode connected to the ground via a capacitor.

Thus, in the present invention, the IC pads 15, substrate pads 21, and external electrodes 24 associated with one of the first, second, and third groups of signal lines are separated from those of other groups by allowing extra members (terminals and external electrodes) not belonging to any of these groups to intervene among them.

Accordingly, signal lines that are highly likely to interfere one another in proximity are separated and spaced apart on both the IC chip body and the package substrate, thereby reducing the interference among the signal lines, and hence reducing erroneous operation of the semiconductor device and noise involved.

The IC pads 15, substrate pads 21, and external electrodes 24 associated with the first through third groups of signal lines, respectively, preferably occupy different ends of the IC chip body and of the multiplicity of external electrodes, respectively. Alternatively, the IC pads 15, substrate pads 21, and external electrodes 24, respectively associated with the first through third groups of signal lines, may occupy different corners, or different end(s) and corner(s) of the IC chip body and of the multiplicity of external electrodes, respectively, depending on the property of the signal lines of the group.

The external electrodes associated with first through third groups of the signal lines (the electrodes hereinafter referred to as first, second, and third group external electrodes, respectively) preferably occupy different outermost ends of, or near different outermost ends of, the multiplicity of external electrodes. Moreover, the first through third group external electrodes associated with the signal lines that are more likely to emit noise or more likely to be influenced by noise are arranged to occupy the outermost locations of the multiplicity of external electrodes with a higher priority.

Based on this criterion, when each group has many signal lines, it is possible to rank signal line groups in accordance with their likelihood of emitting noise or picking up noise, and assign positional priority to the groups. Such grouping of the signal lines also makes it easy to provide filter circuits for eliminating the noise.

Figure 4:
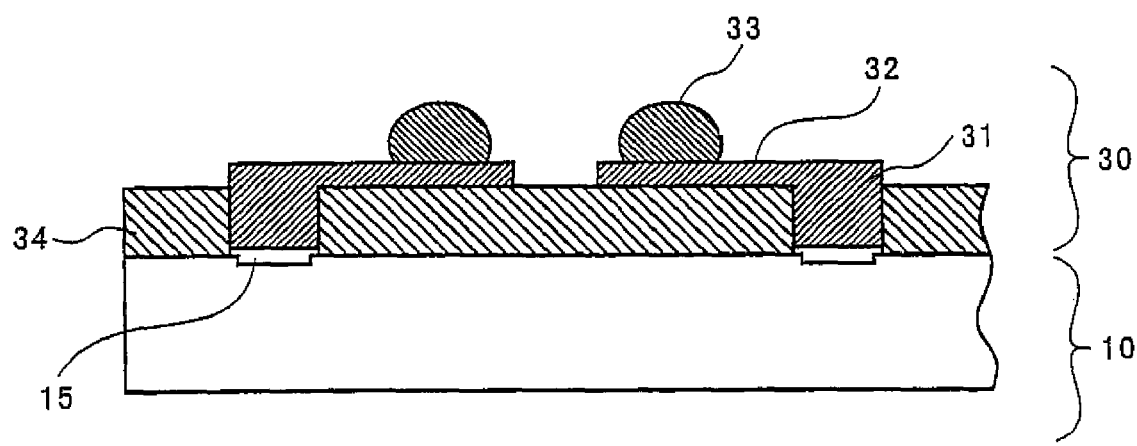
FIG. 4 is a partial sectional view of a semiconductor device having a rewiring layer serving as a package substrate.

Referring to FIG. 4, there is shown in cross section an illustrative CSP of a semiconductor device having a rewiring layer 30 serving as a package substrate. The IC chip body 10 of FIG. 4 is the same as the one shown in FIG. 1.

As shown in FIG. 4, the rewiring layer 30 is provided with the same number of bumps (or protruding electrodes) 31 as the number of IC pads 15 (P11-P49) formed on the IC chip body 10 such that the bumps are in contact with the associated IC pads 15. The (ball-shaped) external electrodes 33 are arranged in a grid (or lattice) configuration, like the pads B1-1-B6-6 as shown in FIG. 2 (there are only two of them shown in FIG. 4). Each of the bumps 31 is connected to an associated one of the external electrodes 33 having a grid configuration by a lead wires 32. The lead wires 32 of FIG. 4 are connected in the same manner as the lead wires 22 of FIG. 2.

In the rewiring layer 30 formed on the IC chip body 10, the bumps 31 are formed to be in electric contact with the respective IC pads 15 of the IC chip body 10. An insulating layer 34 is provided over the rest of the area of the IC chip body 10. The insulating layer 34 may have a thickness that is substantially the same as the height of the bumps 31. The lead wires 32 and the external electrodes 33 are formed on the insulating layer 34.

The inventive semiconductor device that utilizes the rewiring layer 30 as a package substrate comprises:

an IC chip body that includes a circuit section having noisy signal lines and a circuit section having noise susceptible signal lines, and an IC chip body having a multiplicity of IC pads arranged in a rectangular configuration on one side of the IC chip body and along the periphery the IC chip body; and
   rewiring layer that includes
      an insulating substrate 34 having a multiplicity of via-holes,
      a multiplicity of bumps each penetrating one of the via-holes from one side thereof to the other, facing the multiplicity of IC pads, so as to be in electric contact with an associated one of the multiplicity of IC pads,
      a multiplicity of external electrodes arranged in a grid configuration on the insulating substrate and surrounded by the multiplicity of bumps, and
   a multiplicity of lead wires respectively connecting each of the multiplicity of bumps to an associated one of the multiplicity of external electrodes on the other side of the insulating substrate, wherein:
      each of the noisy signal lines is connected to an associated member of a first IC pad group of the multiplicity of IC pads, and each of the noise susceptible signal lines is connected to an associated member of a second IC pad group of the multiplicity of IC pads;
      each IC pad of the first IC pad group is connected to an associated member of a first external electrode group of the multiplicity of external electrodes, while each IC pad of the second IC pad group is connected to an associated member of a second external electrode group of the multiplicity of external electrodes; and
      the first IC pad group is separated and spaced apart from the second IC pad group, and the first external electrode group is separated and spaced apart from the second external electrode group.

Using such rewiring layer 30 as the package substrate of a semiconductor device, and separately arranging the signal lines in the same way as described in connection with FIGS. 1 and 2, it is possible to provide the semiconductor device with the same noise reduction capability as described in connection with FIGS. 1-3. It should be appreciated that the process of forming the IC chip body 10 and the process of forming the rewiring layer 30 can be carried out in one series of steps.

In order to construct an error-free electronic apparatus that involves only suppressed interference of signal lines, the inventive semiconductor device as described above and shown in FIGS. 1-4 may be mounted on the printed circuit board and the like of the apparatus.

What I claim is:
1. A semiconductor device, comprising:
an IC chip body that includes
   a circuit section having signal lines that are likely to emit noise (said signal lines referred to as noisy signal lines),
   a circuit section having signal lines that are susceptible to noise (said signal lines referred to as noise susceptible signal lines), and
   a multiplicity of IC pads arranged in a rectangular configuration on one side of, and along the periphery of, said IC chip body; and
a package substrate that includes
   an insulating substrate having a multiplicity of via-holes formed to penetrate from one side to the other side of said insulating substrate, a multiplicity of pads formed on one side of said insulating substrate (said pads referred to as substrate pads), said substrate pads facing said IC pads and electrically connected to said IC chip body;

a multiplicity of external electrodes formed to protrude from the other side of said insulating substrate, said external electrodes arranged in a grid configuration and surrounded by said substrate pads;

a multiplicity of lead wires individually passing through one of said via-holes, each of said lead wires connecting one substrate pad to an associated one of said external electrodes, wherein:

each of said noisy lines is connected to an associated member of a first group of IC pads of said IC pads (said group referred to as first IC pad group), while each of said noise susceptible lines is connected to an associated member of a second group of IC pads of said IC pads (said group referred to as second IC pad group);

each member of said first IC pad group is connected to an associated member of a first group of external electrodes of said multiplicity of external electrodes (first external electrode group), while each IC pad of said second IC pad group is connected to an associated member of a second group of external electrodes of said multiplicity of external electrodes (second external electrode group);

said first IC pad group is separated and spaced apart from said second IC pad group, and said first external electrode group is separated and spaced apart from said second external electrode group; and said circuit sections include an analog circuit and a digital circuit.

2. The semiconductor device according to claim 1, further comprising one or more other IC pads each having a low impedance provided between said first and second IC pad groups, and one or more other external electrodes each having a low impedance provided between said first and second external electrode groups.

3. The semiconductor device according to claim 1, wherein said first and second IC pad groups occupy different ends or corners of said multiplicity of IC pads.

4. The semiconductor device according to claim 3, wherein said first and second groups of external electrodes respectively occupy different ends of, or locations near different outermost ends of, said multiplicity of external electrodes.

5. The semiconductor device according to claim 1, wherein said circuit sections connected to noisy signal lines include a clock circuit or a large-current input/output circuit.

6. The semiconductor device according to claim 1, wherein said circuit sections connected to noise susceptible signal lines include amplifier circuits having high input-impedances or input/output circuits that have analog properties.

7. An electronic apparatus equipped with the semiconductor device defined in any one of claims 1-6.

* * * * *